United States Patent [19]

Kotaki et al.

[11] Patent Number: 5,028,990
[45] Date of Patent: Jul. 2, 1991

[54] SEMICONDUCTOR MEMORY DEVICE HAVING IMPROVED DYNAMIC MEMORY CELL STRUCTURE

[75] Inventors: Hiroshi Kotaki; Yasukazu Inoue, both of Tokyo, Japan

[73] Assignee: NEC Corporation, Tokyo, Japan

[21] Appl. No.: 337,692

[22] Filed: Apr. 13, 1989

[30] Foreign Application Priority Data

Apr. 13, 1988 [JP] Japan .................................. 63-92328

[51] Int. Cl.$^5$ ...................... H01L 29/68; H01L 27/02; H01L 23/48
[52] U.S. Cl. .................................. 357/23.6; 357/23.5; 357/51; 357/71
[58] Field of Search ........................ 357/23.6, 23.5, 51, 357/71

[56] References Cited

FOREIGN PATENT DOCUMENTS

0176148 8/1986 Japan .................................. 357/23.6

Primary Examiner—Rolf Hille
Assistant Examiner—Wael Fahmy
Attorney, Agent, or Firm—Sughrue, Mion, Zinn, Macpeak & Seas

[57] ABSTRACT

A semiconductor memory device having an improved storage capacitor is disclosed. The memory device comprises a dynamic memory cell which including a gating transistor having first and second semiconductor regions formed on a surface of a semiconductor substrate and opposite in conductivity type to the semiconductor substrate, a gate insulating layer formed on the surface of the substrate between the first and second regions, a gate formed on the gate insulating layer and a first insulating layer covering the surface of the gate, and a storage capacitor having a second insulating layer thicker than the first insulating layer and formed on the surface of the semiconductor substrate via the first insulating layer, the second insulating layer having a trench exposing the surface of first region, a first conductive layer formed on the side wall of trench of the second insulating layer and connected to the first region, a dielectric insulating layer formed on the first conductive layer and a second conductive layer formed on the dielectric insulating layer.

8 Claims, 5 Drawing Sheets

SEMICONDUCTOR MEMORY DEVICE HAVING IMPROVED DYNAMIC MEMORY CELL STRUCTURE

BACKGROUND OF THE INVENTION

1. Field of the Invention

The present invention relates to a dynamic type semiconductor memory device employing one-transistor type dynamic memory cells composed of a storage capacitor and a gating MOS transistor and, more particularly to an improvement of a structure of the storage capacitor of the memory cell.

2. Description of the Related Art

In memory technology, the emphasis has been made on increasing the memory capacity i.e., the integration density of memory cells in a single semiconductor chip. To this end, it is important to minimize the surface area of the respective memory cells because the surface area of the chip usable for a memory cell array is limited. Under the above circumstance, the one-transistor type memory cell composed of a storage capacitor and a gating transistor is advantageously utilized in the dynamic memory device with its minimized occupation area. In this memory device employing the one-transistor type memory cells, a capacitance value of the storage capacitor is a very important factor to determine a read-write characteristic of the memory device, because data stored in the storage capacitor is read out in accordance with a capacitance ratio between the storage capacitor and a stray capacitance of a bit line. Particularly, for a high signal-to-noise ratio, it is required that the capacitance of the storage capacitor should be large compared to the stray capacitance of the bit line. In order to provide the storage capacitor having a large capacitance, the so-called stack-type capacitor and the trench-type capacitor have been known.

The stack-type capacitor is constructed in such a manner that a pair of capacitor plates with a dielectric insulating layer are formed above a major surface of a semiconductor chip to overlay the gate of the gating transistor of the memory cell and a part of a word line. Namely, according to the stack-type capacitor structure, the storage capacitor is partially overlapped with the gating transistor so that a resultant surface area occupied by such large capacitance storage capacitor and the gating transistor can greatly reduced.

The, the trench-type capacitor is formed in such a manner that a groove or trench is formed in a major surface of the semiconductor chip and an upper capacitor plate is formed in the trench along its surface via an insulating layer. According to the trench-type capacitor, an effective surface of the capacitor plate is increased in a vertical direction along the depth of trench so that the storage capacitor having a relatively large capacitance is obtained with a small surface area on the semiconductor chip.

However, the conventional capacitor techniques stated above have many shortcomings. In regard to the stack-type capacitor, first, the surface area is not increased so much in comparison with that of the conventional planar-type capacitor since the stepped part formed over the gate electrode, the word line or the like is small. To increase the capacitance, it is necessary to increase an area occupied by a memory cell. In regard to the trench type capacitor, wherein the trench is formed in the semiconductor substrate, the capacitance can be increased by forming the trench deeper without enlarging the memory cell. However, this capacitor has short-comings that the leakage of stored charge increases with the depth of the trench and that adjacent trenches must be separated sufficiently to prevent the mutual contact of depletion layers expanding from these trenches, so as not to cause a leakage between the trenches.

SUMMARY OF THE INVENTION

It is an object of the present invention to provide a semiconductor memory cell having an improved storage capacitor which has a large capacitance.

It is another object of the present invention to provide a dynamic memory cell structure which can be formed with the minimum surface area and has the reduced leak characteristic of the stored charge in the capacitor.

It is still other object of the present invention to provide a semiconductor device having a large number of dynamic memory cells which include a large capacitance storage capacitor, respectively.

The semiconductor memory device according to the present invention comprises a plurality of dynamic memory cells formed on a semiconductor substrate of a first conductivity type, each of the memory cells including a gating field effect transistor having first and second regions of a second conductivity type opposite to the first conductivity type at a surface of the semiconductor substrate, a gate insulating layer formed on the surface of the semiconductor substrate between the first and second region, a gate electrode formed on the gate insulating layer and a first insulating layer covering a surface of the gate electrode, the first insulating layer having a first thickness, and a storage capacitor having a second insulating layer formed on the surface of the semiconductor substrate via the first insulating layer, the second insulating layer having a second thickness larger than the first thickness and having a first trench exposing the surface of the first region, a first conductive layer formed on a side wall of the trench of the second insulating layer and electrically connected to the first region, a dielectric insulating layer formed on a surface of the first conductive layer, and a second conductive layer formed on a surface of the dielectric insulating layer.

In the present invention, it is desirable to set the second thickness to more than three times that of the first thickness at and set the second thickness more than 2 $\mu$m in order to provide a side wall of the trench which is sufficient to provide the effective capacitor area.

According to the present invention, the side wall of the thick second insulating layer is utilized to form the storage capacitor and therefore, the storage capacitor having a large capacitance can be obtained without occupying an increased surface area of the memory cell on the semiconductor substrate.

BRIEF DESCRIPTION OF THE DRAWINGS

The above and further objects, features and advantages of the present invention will become more apparent from the following detailed description taken in conjunction with the accompanying drawings, wherein:

FIGS. 3 through 7 are schematic views illustrating major steps for fabricating the memory device according to one embodiment of the present invention in which FIGS. 3A, 4A, 6A and 7A are plan views and FIGS. 3B, 4B, 5, 6B and 7B are cross-sectional views along axis A—A'.

DETAILED DESCRIPTION OF THE INVENTION

Prior Art

Figure 1:
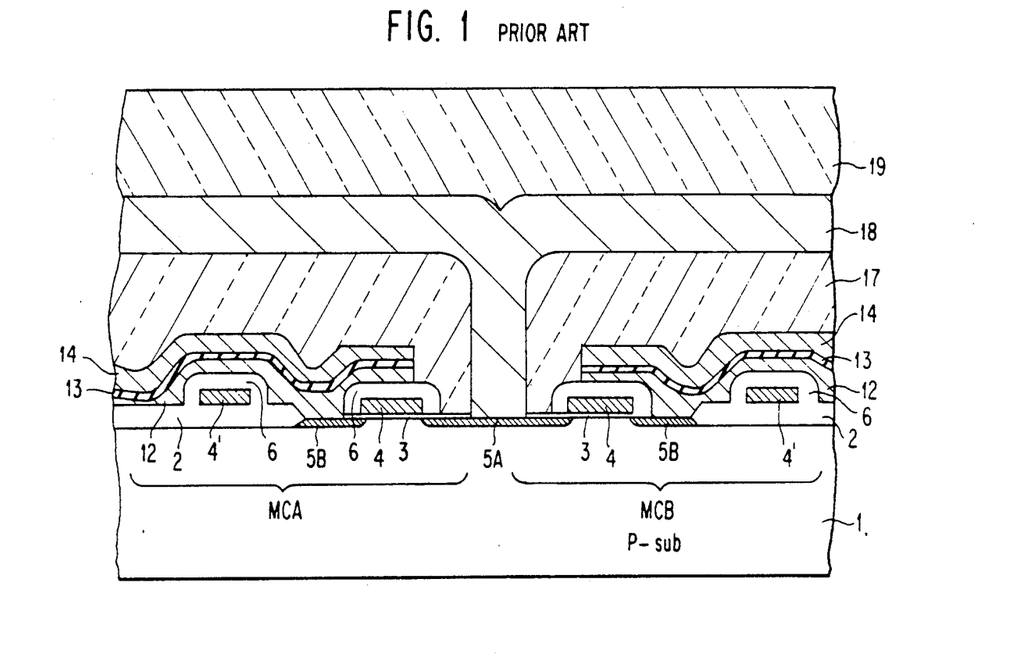
FIG. 1 is a schematic cross-sectional view of one example of a memory device in the prior art.

Referring FIG. 1, the part of the memory device employing the stack-type capacitors in the prior art will be explained briefly. In FIG. 1, two adjacent memory cells MCA and MCB connected to the same digit line 18 are illustrated. Each of the memory cells MCA and MCB is formed on a P-type semiconductor substrate 1 and includes a gate transistor having a gate 4, a gate insulating layer 3, N-type regions 5A and 5B serving as source and drain and, a stack-type storage capacitor formed on the gate 4 and a part of word line 4' which simply passes the memory cell MCA or MCB without connection thereto via a field oxide layer 2 and an insulating layer 6. The stack-type capacitor includes a lower plate 12 formed of polycrystalline silicon and connected to the N-type region 5B, a dielectric insulating layer 13 and an upper plate 14 of polycrystalline silicon.

The digit line 18 formed of aluminum is connected to the N-type region 5A via a contact hole formed in an insulating layer 17 and covered by a protective insulating layer 19.

According to this structure, the storage capacitor is allowed to overlap the gating transistor so that a reduction in the surface area is achieved in each of the memory cells. However, it is necessary to increase the size of the storage capacitor for the larger capacitance thereof. Therefore, there is limitation in increasing the capacitance of the storage capacitor without decreasing the memory capacity or increasing the memory capacity without decreasing the capacitance of the storage capacitor.

Figure 2:
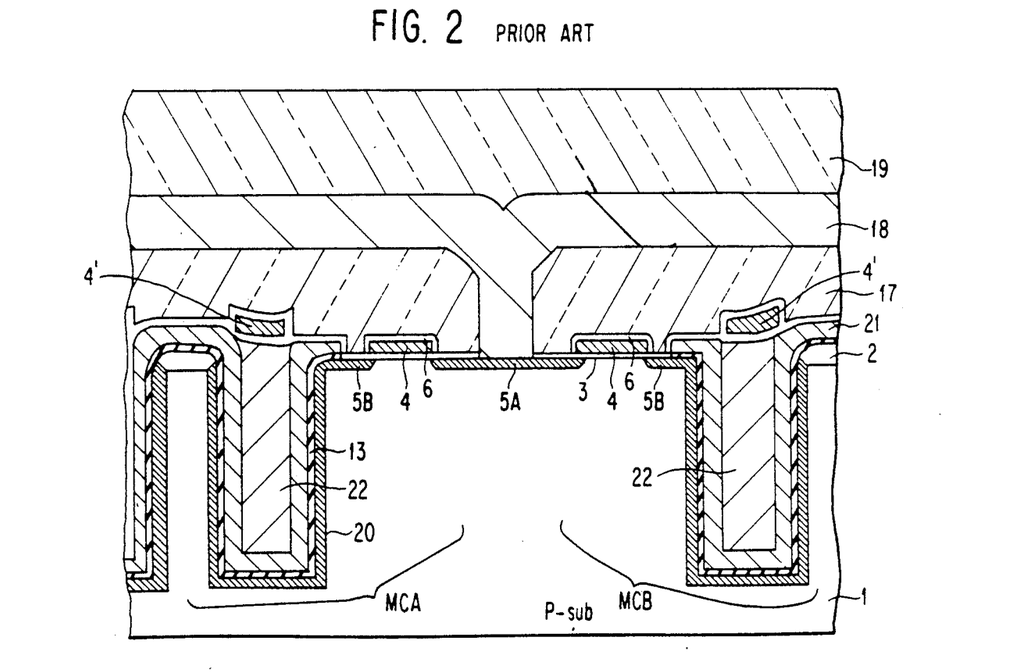
FIG. 2 is a schematic cross-sectional view of another example of a memory device in the prior art.

With reference to FIG. 2, the memory device employing the trench-type capacitor in the prior art will be explained.

In FIG. 2, the portions or elements corresponding to those of FIG. 1 are denoted by the same references and explanations thereto will be omitted.

As illustrated in FIG. 2, each of the memory cells MCA and MCB has the trench capacitor formed in the trench and includes an N-type region 5B' formed along the surface of the trench, a dielectric insulating layer 13 and an upper plate 21 of polycrystalline silicon. A resultant groove of the plate 21 is filled with polycrystalline silicon 22 to make the resultant surface flat. According to this structure, the capacitance of the storage capacitor is increased by the trench. However, the area of the N-type region 5B' is largely increased to spread along the trench. The leakage between the region 5B' and the substrate and the leakage between the regions 5B' are also increased. To this end, it is necessary to separate the adjacent regions 5B' sufficiently to prevent the mutual contact of depletion layers expanding from the adjacent N-type regions 5B'.

Embodiments

Next, a description will be made on the present invention.

With reference to FIGS. 3A, 3B through 7A, 7B, the memory device according to one embodiment of the present invention will be explained along with the major steps for fabricating the memory device.

In the drawings FIGS. 3A, 3B–7A, 7B, the portions or elements corresponding to those in the previous drawings FIGS. 1 and 2 are denoted by the same references and explanations thereto will be omitted.

Figure 3A:
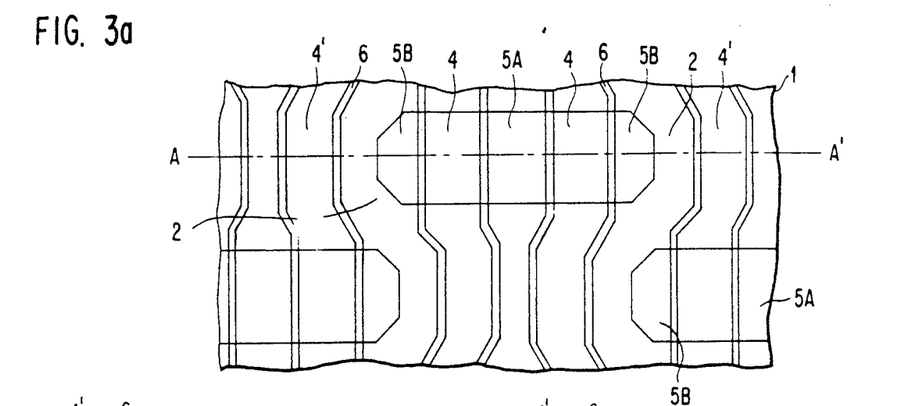
Figure 3B:
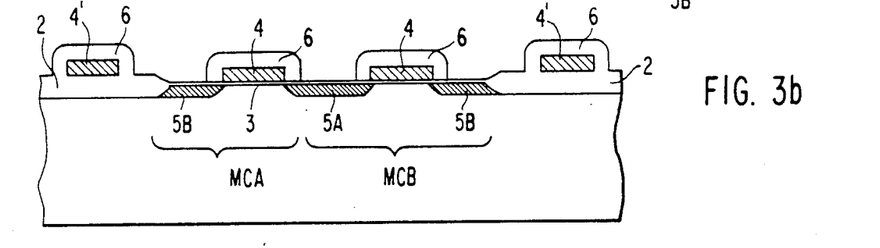

As shown in FIGS. 3A and 3B, MOS-type gating transistors each including N-type regions 5A and 5B, a gate insulating layer 3 and a gate electrode 4 formed of polysilicon are formed on the P-type semiconductor substrate 1 after a thick field oxide layer 2 is formed in a known way. Simultaneously with the formation of the gates 4, word lines made of polycrystalline silicon are formed. The parts 4' of the word lines simply pass the memory cells (MCA, MCB) and have connections to other memory cells not shown here. Then, the surface of the gates 4 and the word lines 4' are covered with an insulating layer ($SiO_2$) 6 by a known chemical vapor deposition (CVD) technique.

The thickness of the field oxide layer 2 is approximately 0.2 to 0.8 $\mu$m and the thickness of the layer, 6 is approximately 0.1 to 0.4 $\mu$m.

Figure 4A:
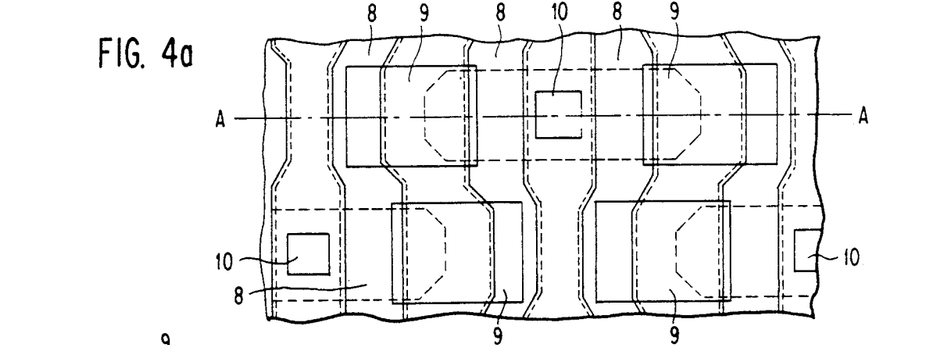
Figure 4B:
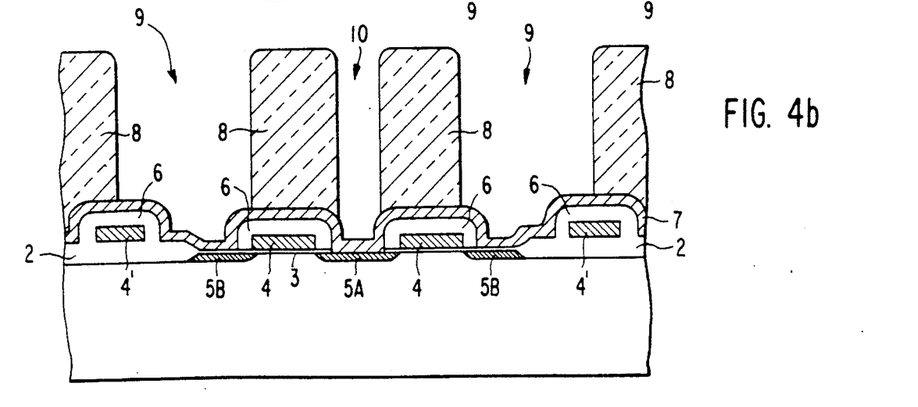

Then, a nitride film 7 having a film thickness of about 0.1 to 0.15 $\mu$m and a borophosphosilicate glass (BPSG) film 8 having a film thickness of about 4.0 to 5.0 $\mu$m are formed and thereafter anisotropic etching such as reactive ion etching (RIE) technique is applied to a prescribed spot of the BPSG film 8 with the nitride film 7 used as an etching stopper. As a result, grooves 9 for a capacitor and a groove 10 for a contact are formed in the BPSG film 8, as shown in FIGS. 4A and 4B. Here, the thickness of the BPSG film 8 is preferably set at more than three times the thickness of the layer 6. The BPSG film 8 is formed with the thickness more than 2 $\mu$m.

Figure 5:
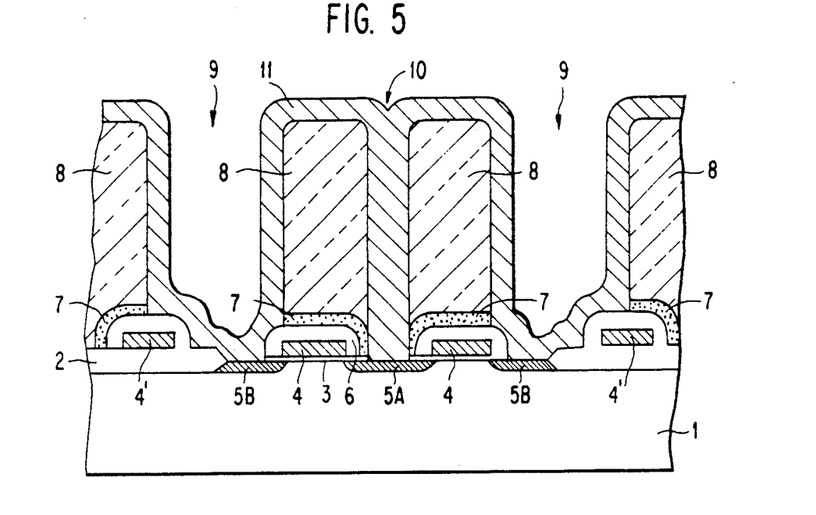

Then, the nitride film 7 in the bottom parts of the capacitor grooves 9 and the contact groove 10 are removed by etching. Thereafter a first polycrystalline silicon 11 doped with N-type impurities opposite to that of the substrate is formed, as shown in FIG. 5. The first polycrystalline silicon 11 is contacted with the regions 5A and 5B in the bottom parts of the grooves 9 and 10, respectively. By depositing the first polycrystalline silicon 11 in a film thickness larger than the radius of the opening of the contact groove, the contact groove 10 is filled with the first polycrystalline silicon, while the power plate 12 for the capacitor is formed thereby in the capacitor groove 9.

In the present embodiment, the contact groove 10 is opened in the shape of a square being 0.65 $\mu$m on one side, and the film thickness of the first polycrystalline silicon is made to be 0.35 $\mu$m.

Figure 6A:
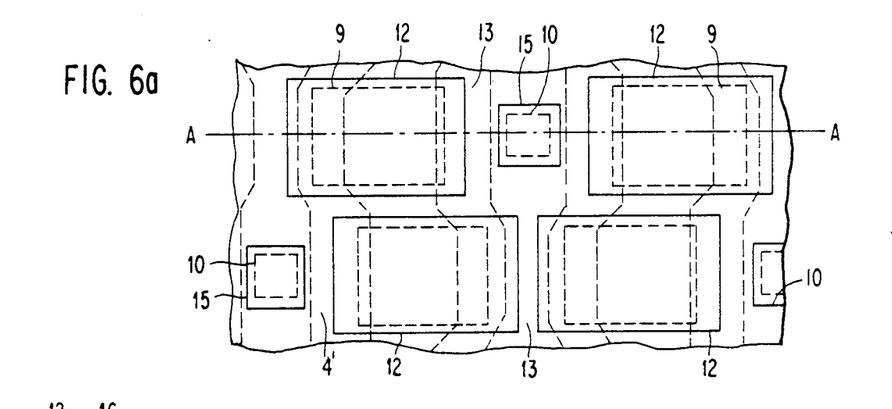
Figure 6B:
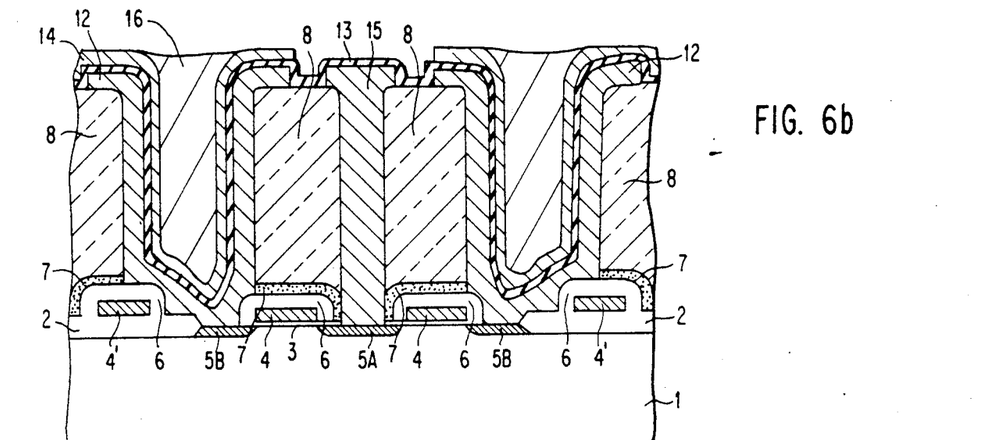

Then, the first polycrystalline silicon 11 is patterned so as to separate it into the lower capacitor plate 12 of the capacitor and an intermediate conductor 15 for the contact of the digit line 18 with the region 5A, a capacitor insulating film 13 and second polycrystalline silicon (upper electrode of the capacitor) 15 doped with N-type impurities are formed. Thereafter, the capacitor grooves 9 being filled with third polycrystalline silicon 16, and subsequently patterning is made for the polycrystalline silicon 14 so as to form the upper plate of the capacitor, as shown in FIGS. 6A and 6B.

Thereafter, an interlayer insulating layer 17 is formed by a well-known method. Thereafter, a contact hole to expose the upper surface of the polycrystalline silicon 15 is formed in the layer 17 by etching. Then, the bit line 18 of aluminum which is contacted to the upper surface of the polycrystalline silicon 15, is formed in a known method. Thus, the N-type region 5A is electrically connected to the bit line 18. Thereafter, the protective insulating layer 19 is formed to cover the surface of the resultant structure, as shown in FIGS. 7A and 7B.

Figure 7A:
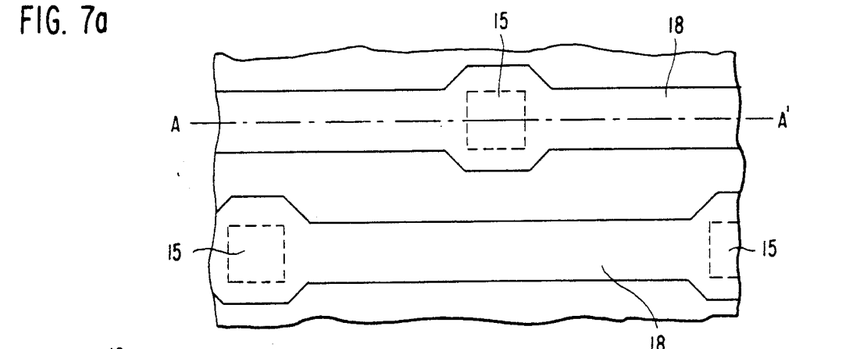
Figure 7B:
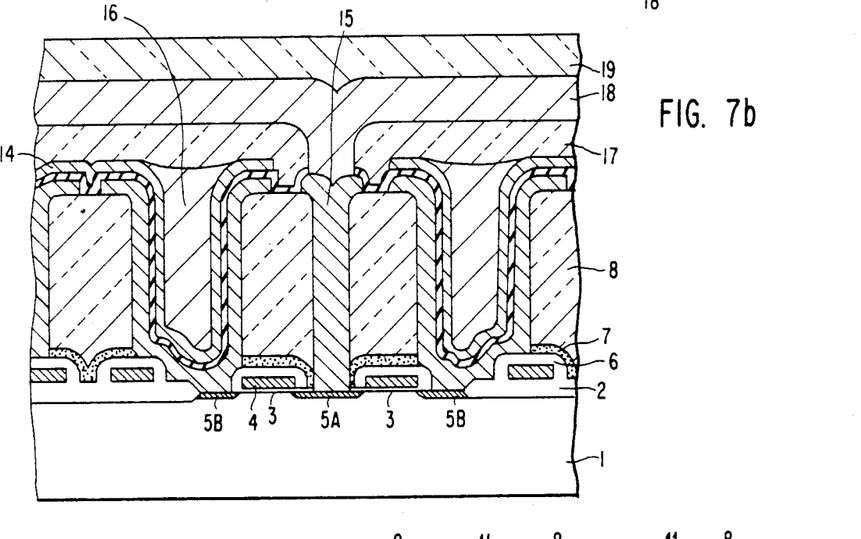

As is seen from FIG. 7, the memory device according to this embodiment, the capacitor plates 12 and 14 are formed not only on the upper surface of the BPSG film 8 but also along the side face of the BPSG film 8, and therefore, the effective surface area of the storage capacitor is remarkably increased.

Next, with reference to FIGS. 8 to 10, the memory device according to a second embodiment of the present invention will be explained along with the major steps for manufacturing it.

Figure 8:
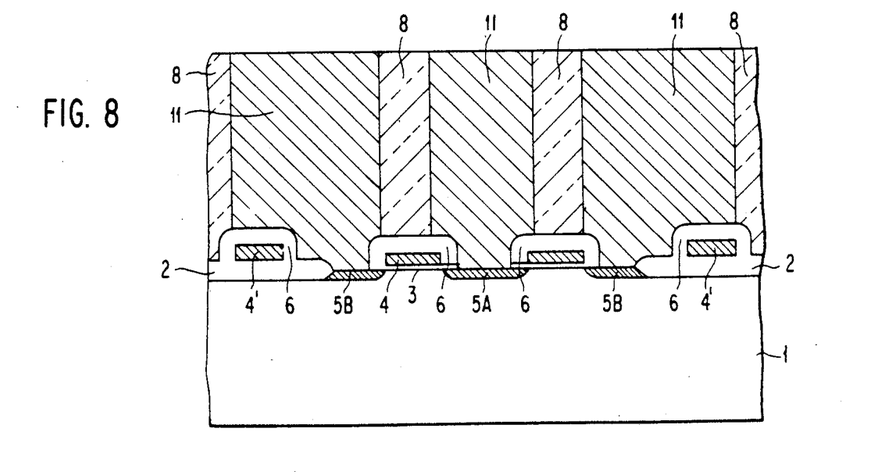
FIGS. 8 through 10 are schematic cross-sectional views illustrating major stages for fabricating the memory device according to another embodiment of the present invention.
Figure 9:
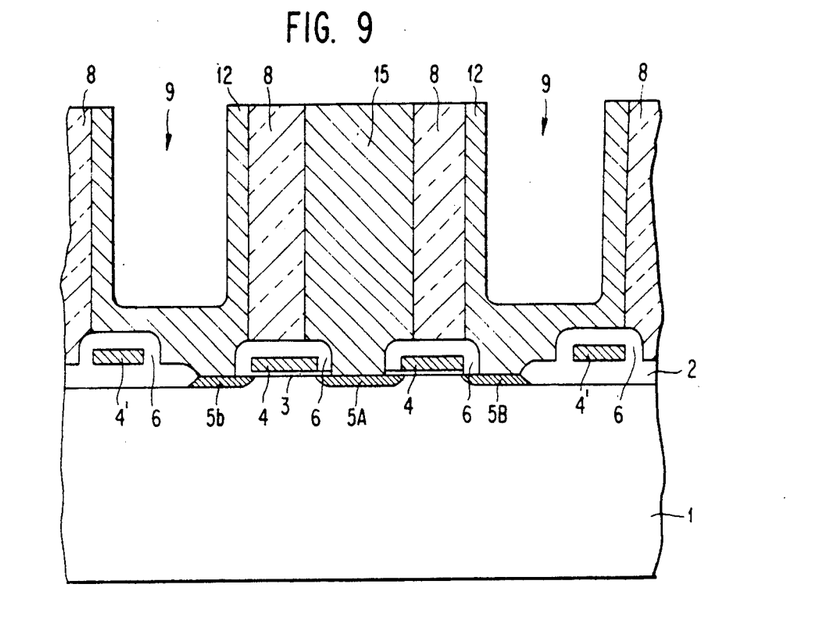
Figure 10:
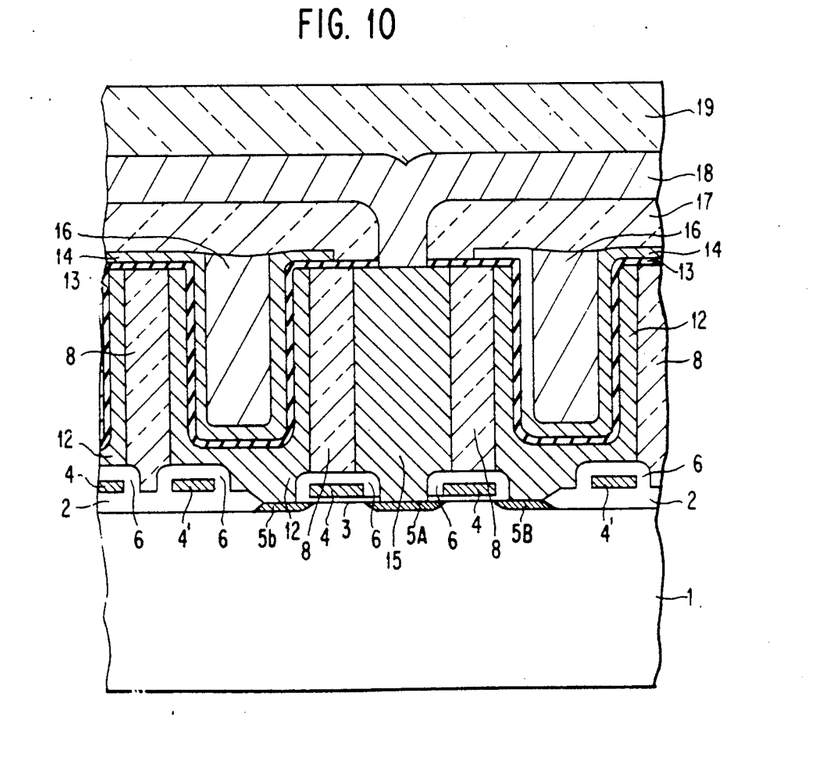

In FIGS. 8-10, the portions and elements corresponding to those in the previous drawings are denoted by the same references.

FIG. 8 shows a process wherein the first polycrystalline silicon 11 of the N-type is formed after the LDD-type transistors are formed in the same way as in FIG. 2A and the polycrystalline silicon 11 is then patterned to form isolating grooves. Then a BPSG film 8 which is an insulator is buried in the isolating grooves, as shown in FIG. 8. The polycrystalline silicon thus isolated turns to be the lower electrode of the capacitor and the intermediate conductor for the contact of the digit line with the source-,drain region of the transistor, each of which is made to contact with one of the source-drain region of the transistor.

FIG. 9 shows a process wherein, after the first polycrystalline silicon 11 is isolated by the insulating BPSG film 8, grooves 9 are formed in the first polycrystalline silicon thick film 11 to be a capacitor region, and the lower electrode 12 of the capacitor is formed.

The structure of FIG. 10 is obtained through the same processes as those of the first embodiment thereafter.

Since the film thickness of the lower electrode 12 of the capacitor is not dependent on the radius of the opening of the contact groove, according to this method, while it is dependent thereon in the first embodiment, the intermediate conductor 15 for the contact of the digit line 18 with the source-drain region 5A of the transistor can be formed to be thick, and this produces an advantage that a contact resistance can be made small.

According to the present invention, as described above, the stack-type capacitor is formed along the inner wall of a groove, and the contact of a digit line with a source-drain region of a transistor can be secured easily even when the depth of the groove is made larger. Therefore the capacity of the capacitor can be made large as the depth of the groove is made large, without enlarging an area occupied by a call, and thus it has an effect of enabling the attainment of high integration.

I claim:

1. A semiconductor memory device comprising a plurality of dynamic memory cells formed on a semiconductor substrate of a first conductivity type, each of said memory cells including a grating field effect transistor having first and second regions of a second conductivity type opposite to said first conductivity type and formed at a surface of said semiconductor substrate, a gate insulating layer formed on the surface of said semiconductor substrate between said first and second regions, a gate electrode formed on said gate insulating layer and a first insulating layer covering an upper surface and side surfaces of said gate electrode, said first insulating layer having a first thickness, and a storage capacitor having a second insulating layer formed on the surface of said semiconductor substrate via said first insulating layer, said second insulating layer having a first trench exposing the surface of said first and having a first trench exposing the surface of said first region and a first part of the side surface of said first insulating layer adjacent to said first region and a second part of the upper surface of said first insulating layer adjacent to said first part, a first conductive layer formed on a side wall of said first trench of the second insulating layer and on the exposed surface of said first region in said first trench and electrically connected to said first region, said first conductive layer extending to an upper surface of said second insulating layer to cover a part of said upper surface, a dielectric insulating layer formed on a surface of said first conductive layer, and a second conductive layer formed on a surface of said dielectric insulating layer.

2. The semiconductor memory device according to claim 1, in which said second insulating layer includes a second trench for exposing a surface of said second region, said memory device further comprising a conductive material filled in said second trench and electrically connected to said second region, and a digit line connected to said conductive material.

3. The semiconductor memory device according to claim 1, in which said first and second conductive layers are formed of polycrystalline silicon.

4. The semiconductor memory device according to claim 1, in which said second thickness is more than three times of said first thickness.

5. The semiconductor memory device according to claim 1, in which said first insulating layer is formed of silicon dioxide and said second insulating layer is formed of boronphosphorous silicate glass.

6. A semiconductor memory device comprising a plurality of dynamic memory cells formed on a substrate of a first conductivity type on which a plurality of isolation regions and element formation regions surrounded by said isolation regions are defined, a field oxide layer formed on said isolation regions, each of said memory cells including a gating field effect transistor having first and second regions of a second conductivity type opposite to said first conductivity type and formed at a surface of one of said element formation regions, a gate insulating layer formed on the surface of one of said element formation regions between said first and second regions, a gate electrode formed on said gate insulating layer, a first insulating layer covering an upper surface and side surfaces of said gate electrode, and a storage capacitor including a second insulating layer formed on the surface of one of said element formation regions and on the surface of said field oxide adjacent to said one element formation region and having a first trench exposing the surface of said first region, a first part of the side surface of said first insulating layer adjacent to said first region, a second part of the upper part of said first insulating layer adjacent to said first part and a third part of the surface of said field oxide layer adjacent to said first region, a first conductive layer formed on a side wall of said first trench of said second insulating layer and the exposed surface of said first region and electrically connected to said first region, said first conductive layer extending to an upper surface of said second insulating layer to cover a part of said upper surface, a dielectric insulating layer formed on a surface of said first conductive layer, and a second conductive layer formed on a surface of said dielectric insulating layer.

7. The semiconductor memory device according to claim 6, in which said second insulating layer includes a silicon nitride film and a brophosilicate glass formed on said silicon film.

8. The semiconductor memory device according to claim 6, in which a thickness of said second insulating layer is in the range of 4 to 5 $\mu$m.

* * * * *

UNITED STATES PATENT AND TRADEMARK OFFICE
CERTIFICATE OF CORRECTION

PATENT NO. : 5,028,990

DATED : July 2, 1991

INVENTOR(S) : Hiroshi Kotaki and Yasukazu Inoue

It is certified that error appears in the above-identified patent and that said Letters Patent is hereby corrected as shown below:

Col. 4, line 47, delete the second occurrence of ","

Col 6, line 13, after second occurrence of "layer" insert -- having a second thickness larger than said first thickness and --

Col. 6, lines 14 & 15 delete "and having a first trench exposing the surface of said first"

Signed and Sealed this

First Day of December, 1992

*Attest:*

DOUGLAS B. COMER

*Attesting Officer*     *Acting Commissioner of Patents and Trademarks*